United States Patent [19]

Suwa et al.

[11] 4,167,703

[45] Sep. 11, 1979

[54] TUNING APPARATUS WITH BAND-SELECTION MEANS

[75] Inventors: Hisashi Suwa, Sagamihara; Kohei Haneishi, Musashino, both of Japan

[73] Assignee: Sony Corporation, Tokyo, Japan

[21] Appl. No.: 906,407

[22] Filed: May 16, 1978

[30] Foreign Application Priority Data

May 17, 1977 [JP] Japan .................................. 52-56826

[51] Int. Cl.$^2$ ............................................. H04B 1/06
[52] U.S. Cl. .................................... 325/455; 325/459
[58] Field of Search ............... 325/315, 458, 459, 464, 325/465, 452, 456, 457; 334/86, 87, 18, 19, 29; 116/241, 242, 248, 249

[56] References Cited

U.S. PATENT DOCUMENTS

| 2,188,490 | 1/1940 | Vorie | 325/455 |
| 2,739,232 | 3/1956 | Schwarz | 325/457 |

Primary Examiner—Robert L. Richardson
Assistant Examiner—Alexander Gerasimow
Attorney, Agent, or Firm—Lewis H. Eslinger; Alvin Sinderbrand

[57] ABSTRACT

Tuning apparatus of the type including at least first and second tuners, such as AM and FM tuners, operable to be tuned over respective broadcast frequency bands. The tuning apparatus includes a dial scale calibrated in at least two sets of gradations to represent the particular frequencies in the respective frequency bands to which the tuners are tuned and an indicator movable across the scale to indicate the frequency to which a respective tuner is tuned. The apparatus comprises at least one first settable element associated with a corresponding frequency band to be set to a desired location along the scale and at least one second settable element associated with a different frequency band to be set to a desired location along the scale. Sensors are coupled to and movable with the indicator to sense each of the first and second settable elements as the indicator is moved across the scale. A control signal generator generates a respective control signal when the indicator is positioned such that the sensors sense a corresponding one of the settable elements. An output is derived from a respective one of the tuners when a control signal is generated corresponding to the sensing of a particular one of the settable elements.

12 Claims, 4 Drawing Figures

TUNING APPARATUS WITH BAND-SELECTION MEANS

BACKGROUND OF THE INVENTION

This invention relates to tuning apparatus and, more particularly, to such tuning apparatus which is capable of being tuned over plural broadcast frequencies, such as AM and FM frequencies, and in which the tuning apparatus automatically is switched from one to another frequency band in response to the selection of a desired frequency.

Radio receiving apparatus is commercially available wherein the radio receiver can be tuned to a desired frequency in any one of plural broadcast frequency bands. For example, a so-called AM/FM radio receiver is provided with an AM tuner and with an FM tuner. Either one or the other of the AM and FM tuners can be operated to select a desired broadcast frequency either in the AM frequency band or in the FM frequency band.

In a typical AM/FM radio receiver, a dial scale is provied with two sets of calibrated gradations. One set of gradations represents the AM frequencies which can be received; and the other set of gradations represents the FM frequencies which can be received. In general, the AM frequency gradations and the FM frequency gradations are represented in respective linear arrays. An indicator, such as a dial needle, is moved in correspondence with the tuning of the AM or FM tuners. A single indicator may be provided so as to simultaneously scan the AM and the FM frequency gradations during a tuning operation.

Usually, a frequency band selection switch must be operated in addition to a tuning knob so that the user will be provided with an indication of the particular AM or FM frequency to which the radio receiver is tuned. Thus, if the radio receiver is tuned to a particular AM frequency, and if the user then wishes to tune the radio receiver to a desired FM frequency, the tuning knob must be operated to dispose the indicator at the desired FM frequency gradation and, in addition, the frequency band selection switch must be operated to switch from the AM tuner to the FM tuner. If the radio receiver then is to be tuned to another desired AM frequency, the foregoing operation must be repeated wherein the tuning knob is adjusted to position the indicator at the desired AM frequency gradation and the frequency band selection switch also must be operated to change from FM band selection to AM band selection. Accordingly, this two-step operation, i.e., tuning knob adjustment and frequency band selection, may be troublesome to the user. Typically, when the user wishes to receive a broadcast frequency from a different frequency band, he often forgets to operate the frequency band selection switch.

OBJECTS OF THE INVENTION

Therefore, it is an object of the present invention to provide a novel tuning apparatus which is simple to operate and which avoids troublesome disadvantages of prior art apparatus.

Another object of this invention is to provide tuning apparatus wherein the apparatus can be tuned to a broadcast frequency in one frequency band which differs from the frequency band to which the apparatus had been tuned previously, in accordance with an automatic frequency band change-over operation.

A further object of this invention is to provide improved tuning apparatus including plural tuners, such as an AM tuner and an FM tuner, and further including settable elements which can be set to desired frequencies in the different frequency bands, such as an AM frequency and an FM frequency, whereby the associated frequency band automatically is selected when the tuning indicator of the apparatus is positioned at a frequency gradation corresponding to that selected by the settable element.

Various other objects, advantages and features of the present invention will become readily apparent from the ensuing detailed description, and the novel features will be particularly pointed out in the appended claims.

SUMMARY OF THE INVENTION

In accordance with this invention, tuning apparatus is provided with at least first and second tuners operable to be tuned over respective broadcast frequency bands. The apparatus further includes a dial scale calibrated in at least two sets of gradations to represent the particular frequencies in the respective frequency bands to which the tuners are tuned. An indicator, operable with the tuning of the respective tuners, is movable across the scale to indicate the frequency to which a tuner is tuned. The tuning apparatus comprises at least one first settable element associated with a corresponding frequency band to be set to a desired location along the scale and at least one second settable element associated with a different frequency band to be set to a desired location along the scale. Sensors are coupled to and movable with the indicator to sense each of the settable elements as the indicator is moved across the scale. A control signal generator generates a respective control signal when the indicator is positioned such that the sensors sense a corresponding one of the settable elements. An output is provided from a respective one of the tuners in accordance with the particular control signal which is generated, thus providing an output from the tuner which is associated with the first or second settable elements that is sensed by the sensors.

BRIEF DESCRIPTION OF THE DRAWINGS

The following detailed description, given by way of example, will best be understood in conjunction with the accompanying drawings in which.

DETAILED DESCRIPTION OF THE PREFERRED EMBODIMENTS

Figure 1:
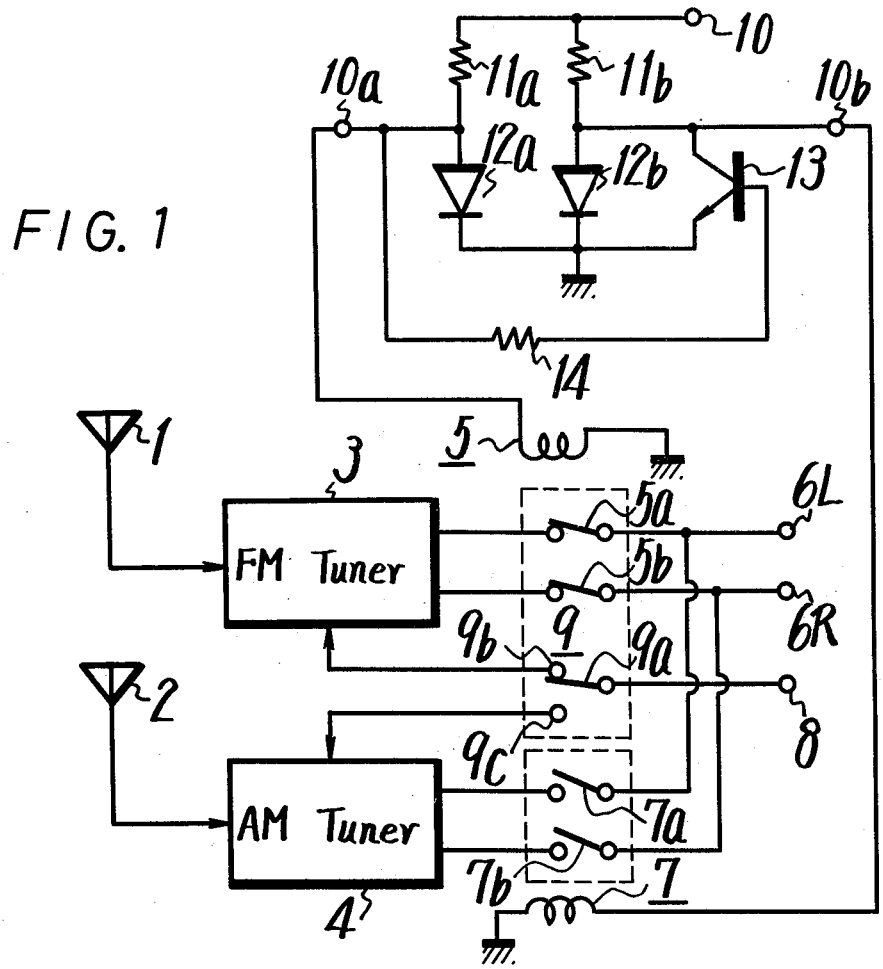
FIG. 1 is a circuit diagram showing one embodiment of the present invention.

Referring now to FIG. 1, a circuit diagram in accordance with the present invention is illustrated in conjunction with tuning apparatus for a radio receiver of the type including a plurality of tuners. In order to simplify the following discussion, and in the interest of brevity, only two such tuners are illustrated, these tuners being constituted by an FM tuner 3 and an AM tuner 4. However, it should be appreciated that the present invention is equally applicable to radio receiver tuning apparatus which includes additional tuners, such as a short-wave (SW) tuner, a citizens band tuner, and the like. FM tuner 3 is coupled to an FM antenna 1 for receiving an FM broadcast frequency signal; and AM tuner 4 is coupled to an AM antenna 2 for the purpose of receiving an AM broadcast frequency signal. Although two separate antennae are shown herein, it is possible to provide a single, complex antenna for supplying both FM and AM signals to tuners 3 and 4, respectively. A pair of output terminals 6L and 6R are selectively connectible with FM tuner 3 and with AM tuner 4, respectively. These output terminals are adapted to receive left-channel and right-channel signals which are recovered by the respective tuners in accordance with the particular frequency to which the tuners are tuned. As an alternative, the pair of output terminals 6L and 6R can be replaced by a single output terminal for receiving an information signal from one or the other of the tuners. A pair of switches 5a, 5b is interconnected between FM tuner 3 and the pair of output terminals 6L and 6R. Switches 5a and 5b are, for example, relay contacts which are selectively closed or opened in accordance with the particular energization of an associated relay coil 5. As an alternative thereof, switches 5a and 5b may be replaced by transistor switches, or the like. It is appreciated that if switches 5a and 5b are closed, the output from FM tuner 3 is coupled to output terminals 6L and 6R.

Similarly, a pair of switches 7a and 7b is interconnected between the output of AM tuner 4 and output terminals 6L and 6R. Switches 7a and 7b typically may comprise relay contacts which are selectively closed or opened in accordance with the energization of relay coil 7. These switches alternatively may be formed of transistor switching devices.

Energizing potential, such as DC power, is supplied to the respective tuners for the purpose of energizing same and thereby enable these tuners to operate. For this purpose, FM tuner 3 is provided with a power supply input, or DC voltage input terminal, and AM tuner 4 likewise is provided with a DC voltage input terminal. A power supply terminal 8 is adapted to be supplied with a suitable operating potential, and this power supply terminal is selectively coupled to the DC voltage terminals of FM tuner 3 and AM tuner 4 via a change-over switch 9. As shown, the change-over switch is comprised of a movable contact 9a selectively engageable with a first fixed contact 9b or a second fixed contact 9c. Change-over switch 9 is selectively operated in accordance with the energization of relay coil 5 such that when movable contact 9a engages fixed contact 9b, DC power is supplied to FM tuner 3 so as to enable the operation of that tuner; and when movable contact 9a engages fixed contact 9c, DC power is supplied to AM tuner 4 to enable operation of that tuner.

Relay coils 5 and 7 are selectively energized by a control signal generator. The control signal generator includes a pair of output terminals 10a and 10b connected to relay coils 5 and 7, respectively. If output terminal 10a is provided with a relatively high DC potential, then relay coil 5 is energized so as to close switches 5a and 5b and to engage movable contact 9a with fixed contact 9b. Similarly, if output terminal 10b is provided with a relatively high DC voltage, then relay coil 7 is energized to close switches 7a and 7b. As will be described below, only one or the other of output terminals 10a and 10b is provided with a relatively high DC voltage at any one time. Although both output terminals may be provided with a relatively low voltage, both cannot be provided with a relatively high voltage at the same time. Furthermore, when relay coil 5 is de-energized, such as when a relatively low voltage is provided at output terminal 10a, movable contact 9a engages a predetermined one of fixed contacts 9b and 9c. It will be assumed herein that the predetermined fixed contact which movable contact 9a engages when relay coil 5 is deenergized is contact 9b.

The control signal generator includes a power supply terminal 10 adapted to receive a DC operating potential. This power supply terminal is coupled to output terminal 10a by a load resistor 11a and to output terminal 10b by a load resistor 11b. In addition, a photo-sensor, such as a photo diode 12a, is connected between the junction defined by output terminal 10a and resistor 11a and a reference potential such as ground. Similarly, a photo-sensor, such as photo diode 12b, is connected between the junction defined by output terminal 10b and resistor 11b and ground. As an alternative, the photo diodes can be replaced by photo transistors, photo resistors, or the like. When the photo-sensor is illuminated with light, it is conductive so as to reduce the voltage at the output terminal connected thereto to a value which is insufficient to energize relay coil 5 or relay coil 7. However, when light is blocked from the photo-sensor, it becomes non-conductive so as to increase the voltage at the output terminal connected thereto. Hence, when photo-sensor 12a is non-conductive, the voltage provided at output terminal 10a, referred to herein as the control signal, is of a sufficient magnitude to energize relay coil 5. When photo-sensor 12b is non-conductive, the control signal provided at output terminal 10b is of sufficient magnitude to energize relay coil 7.

FIG. 1 also illustrates a switching element connected in shunt relation with one of the photo-sensors, specifically, photo-sensor 12b. This switching element is shown as a transistor 13 whose collector-emitter circuit is connected in parallel with photo-sensor 12b and whose base electrode is connected via a resistor 14 to output terminal 10a. In the event that a control signal of relatively high magnitude is provided at output terminal 10a, transistor 13 is rendered conductive so as to maintain the voltage at output terminal 10b at a relatively low magnitude. This prevents a control signal from being applied to both output terminals 10a and 10b in the event that both photo-sensors 12a and 12b are non-conductive.

Figure 2:
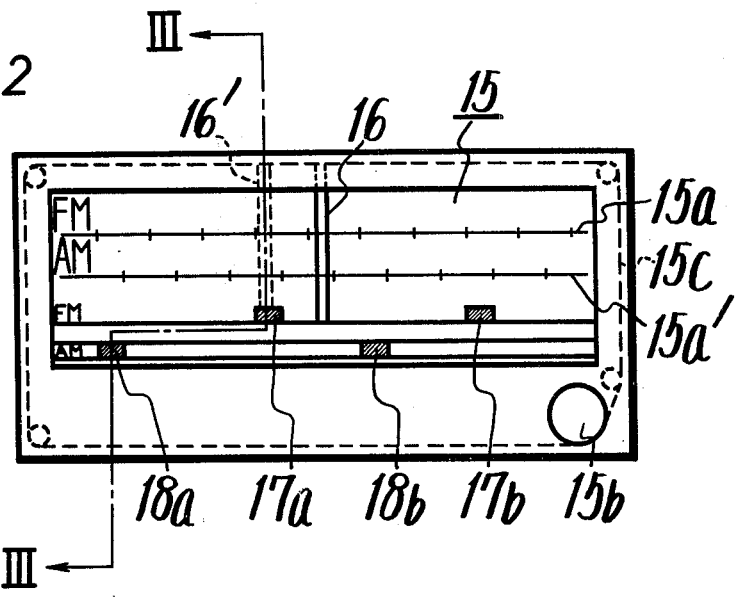
FIG. 2 represents a typical dial scale and tuning indicator, together with settable elements, which can be used with the present invention.

Before describing the operation of the circuitry shown in FIG. 1, reference is made to one embodiment of tuning apparatus with which this invention can be used, as shown in FIG. 2. The tuning apparatus is included in a radio receiver, and FIG. 2 illustrates a dial scale 15 and tuning indicator 16 which is movable across the dial scale. Dial scale 15 is calibrated with a first set of gradations 15a to represent particular frequencies in the FM band. The dial scale also is calibrated in a second set of gradations 15a' which represents frequencies in the AM band. As shown, these gradations are provided in two parallel linear arrays.

Indicator 16, which may be a dial needle, is secured to a cable 15c deployed about a series of guide posts, or rollers, and driven by a tuning knob 15b. Thus, as the tuning knob is rotated, cable 15c drives indicator 16 across the arrays of gradations 15a and 15a'. It is appreciated that tuning knob 15b is mechanically coupled to a conventional tuning element such as an air capacitor, a variable inductor, a potentiometer, or the like, so that as the tuning element is adjusted, indicator 16 represents the particular frequency to which that tuning element then is tuned. Of course, since only a single indicator 16 is provided to scan both arrays of gradations 15a and 15a', the indicator provides dual indications of the FM frequency or the AM frequency to which FM tuner 3 or AM tuner 4 is tuned.

In FIG. 2, two sets of settable elements are provided, each settable element being movable into juxtaposition, or alignment, with a desired frequency in a corresponding array of gradations. Thus, settable elements 17a and 17b are associated with the FM frequency band and are adapted to be moved, or set, to positions in alignment with desired frequency gradations in array 15a. Similarly, settable elements 18a and 18b are associated with the AM frequency band and each element is movable, or settable, to a position in alignment with a desired frequency gradation in array 15a'. Although each set is shown herein as being comprised of two settable elements, it should be appreciated that as many settable elements may be provided as are desired. Furthermore, although the settable elements are shown as being disposed in parallel, linear arrays which are beneath the arrays of gradations 15a and 15a', the settable elements may be movable across the respective FM and AM scales. As a further alternative, each set of settable elements may be disposed adjacent to, and either above or below a corresponding FM or AM scale.

In accordance with this invention, the particular position of a settable element is sensed by indicator 16 as the indicator is moved across arrays of gradations 15a and 15a'. That is, if indicator 16 is positioned at the same gradation to which settable element 17a is set, this condition is sensed. If indicator 16 is positioned at the same gradation to which settable element 18b is set, this condition also is sensed. Thus, when indicator 16 coincides with a settable element, this coincidence is sensed and is used to represent that either the FM tuner is tuned to a preselected, or desired frequency (e.g. the coincidence, or alignment, of indicator 16 with settable element 17a), or the AM tuner is tuned to a preselected, or desired frequency (e.g. the coincidence, or alignment, of indicator 16 with settable element 18b).

Figure 3:
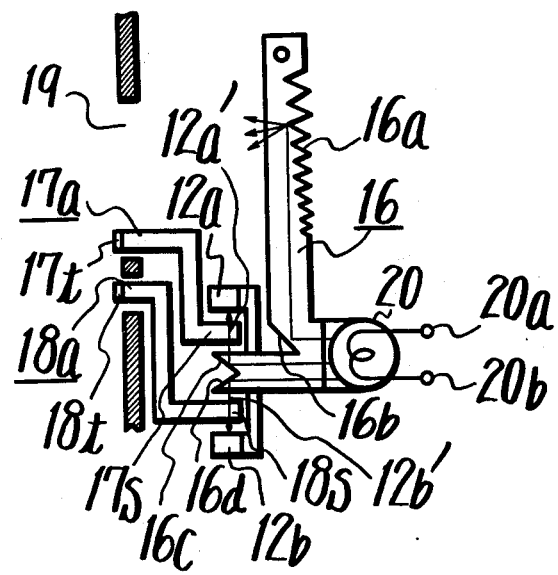
FIG. 3 is a cross-sectional view taken along lines III—III of FIG. 2.

The apparatus which is used to sense when indicator 16 is juxtaposed a frequency gradation that has been selected by a settable element is illustrated in FIG. 3 which is a cross-sectional view taken along lines III—III of FIG. 2. Indicator 16 preferably is formed of a transparent or semi-transparent plastic, such as a synthetic resin, for example, acrylic resin, and is provided with a light-reflecting portion 16a formed of sawtooth elements. When viewed in FIG. 2, sawtooth elements 16a are provided on the rear surface of indicator 16. The indicator also is provided with an additional light reflecting surface 16b which is used to reflect light from a suitable source, such as source 20, upward to sawtooth elements 16a.

An example of light source 20 is an incandescent lamp, a light-emitting diode (LED) or the like. Light source 20 is provided with power supply terminals 20a and 20b adapted to receive an operating potential so as to energize the light source and thus emit light which is reflected to sawtooth elements 16a by light reflecting surface 16b.

Indicator 16 is constructed as an L-shaped element having a leg extending in the horizontal direction, as viewed in FIG. 3. The free end of this leg is provided with light reflecting surfaces 16c and 16d, respectively. Light which is emitted from light source 20 is transmitted through this leg of indicator 16 and is reflected in the upward direction by light reflecting surface 16c and in the downward direction by light reflecting surface 16d. Photo-sensor 12a (shown schematically in FIG. 1) is mounted above this leg of indicator 16 and is spaced therefrom by a gap. Similarly, photo-sensor 12b is mounted below this leg and also is spaced therefrom by a gap. Accordingly, light which is emitted by light source 20 and is reflected by light reflecting surface 16c is transmitted across the upper gap, as shown by arrow 12a', to impinge upon, and thus illuminate photo-sensor 12a. Similarly, light which is emitted from light source 20 is reflected by light reflecting surface 16d downward, as shown by arrow 12b', to impinge upon, or illuminate photo-sensor 12b.

Settable element 17a is shown as a Z-shaped member having a light-shielding element 17s, such as a shutter element, disposed at one end thereof and having a manually grippable element 17t disposed at the opposite end thereof. It is appreciated that shutter 17s is adapted to be disposed within the gap between light reflecting surface 16c and photo-sensor 12a so as to selectively block the photo-sensor from being illuminated. Similarly, settable element 18a is Z-shaped and is provided with a light shield, or shutter element 18s at one end thereof and with a grippable element 18t at the other end thereof. Shutter 18s is adapted to be disposed within the gap between light reflecting surface 16d and photo-sensor 12b so as to block the photo-sensor from being illuminated.

Although light source 20 is used herein to illuminate sawtooth elements 16a of indicator 16 so as to provide clear visual perception of the indicator, it is not necessary that indicator 16 be so illuminated. In that event, light source 20 may be positioned at any suitable location so as to illuminate only the photo-sensors. However, the embodiment shown in FIG. 3 wherein indicator 16 also is illuminated by light source 20 provides an advantageous check to ascertain that the light source is operating properly and, thus, that photo-sensors 12a and 12b also are illuminated.

The operation of the illustrated apparatus now will be described in conjunction with FIGS. 1-3. Let it be assumed that a user wishes to receive a particular FM broadcast frequency. Accordingly, element 17a is positioned in juxtaposition, or in alignment, with the gradation on scale 15a corresponding to the desired frequency. This is achieved by the user gripping portion 17t of element 17a and then sliding this element to the indicated location. Let it also be assumed that the user, in similar manner, has set elements 18a, 18b and 17b to their respectively illustrated positions so as to be in alignment with corresponding gradations on the AM scale 15a' and on the FM scale 15a, respectively. These positions thus are in alignment with particular AM and FM frequencies which are desired to be received.

Once elements 17a, 17b and 18a, 18b have been set, tuning knob 15b is rotated to effect a tuning condition. Let it be assumed that the tuning knob is rotated such that indicator 16 is moved across scale 15 to position 16', that is, the position at which indicator 16 coincides with element 17a. Once in this coinciding position, it is seen, from FIG. 3, that shutter 17s of element 17a is interposed in the gap between photo-sensor 12a and light reflecting surface 16c. Consequently, light beam 12a' is blocked from illuminating this photo-sensor.

While indicator 16 scans scale 15 during a tuning operation, both photo-sensors 12a and 12b are illuminated from light source 20, whereby both photo-sensors are conductive. With respect to FIG. 1, when photo-sensor 12a is conductive, the voltage appearing at output terminal 10a is relatively low. Consequently, relay coil 5 is not energized, and switches 5a, 5b are opened. At the same time, the relatively low voltage at output terminal 10a maintains transistor 13 in its non-conductive condition. Also, when photo-sensor 12b is conductive, the voltage appearing at output terminal 10b is relatively low, whereby relay coil 7 is not energized. Hence, switches 7a, 7b are opened. As a consequence thereof, neither the output from FM tuner 3 nor the output from AM tuner 4 can be transmitted to output terminals 6L, 6R.

However, when indicator 16 is positioned at 16', shutter 17s (FIG. 3) blocks photo-sensor 12a. Accordingly, this photo-sensor no longer is conductive. Therefore, the voltage appearing at output terminal 10a is of a relatively high magnitude so as to energize relay coil 5. This closes switches 5a and 5b so as to couple the output of FM tuner 3 to output terminals 6L and 6R. Therefore, when the tuner is tuned to the FM broadcast frequency selected by element 17a, that is, when indicator 16 is at a location which coincides with the position of element 17a, the output of FM tuner 3 automatically is coupled to output terminals 6L and 6R.

It has been assumed that neither element 18a nor element 18b is positioned in alignment with element 17a. However, if these two different elements are positioned in substantially vertical alignment, as viewed in FIG. 2, then element 17a will block photo-sensor 12a from being illuminated and the other element (e.g. element 18a or element 18b) will block photo-sensor 12b from being illuminated. When photo-sensor 12b is not illuminated, it is rendered non-conductive, whereby the voltage appearing at output terminal 10b is relatively high. However, since it has been assumed that photo-sensor 12a also is non-conductive, the resultant relatively high voltage which is provided at output terminal 10a renders transistor 13 conductive. This shunts output terminal 10b to ground and thus prevents the voltage appearing at this output terminal from attaining a relatively high magnitude due to the non-conduction of photo-sensor 12b. Therefore, by reason of transistor 13, the non-conduction of photo-sensor 12b is overridden. This means that, in the event that elements associated with the FM and AM scales are positioned at substantially the same location with respect to vertical alignment, only one of relay coils 5 and 7 will be energized. It is assumed herein that, in such a condition, only relay coil 5 is energized so as to permit the output from FM tuner 3 to be coupled to output terminals 6L and 6R. If an opposite effect is desired, that is, if it is preferred that the output of AM tuner 4 override the output of FM tuner 3, in the event that an FM-associated element (17a, 17b) and an AM-associated element (18a, 18b) are positioned in alignment, then transistor 13 should be connected in shunt relation with photo-sensor 12a, and the base electrode of transistor 13 should be connected to output terminal 10b.

Let it be assumed that the user of the illustrated apparatus now wishes to change the tuning condition of the tuning apparatus. Let it be further assumed that the user wishes to tune the apparatus to the AM broadcast frequency which is selected by the particular position of element 18a. Accordingly, tuning dial 15b is rotated so as to drive indicator 16 from position 16' to the position wherein the indicator is aligned with element 18a. When indicator 16 is displaced from position 16', photo-sensor 12a, which had been blocked, now is illuminated. Thus, the relatively high voltage appearing at output terminal 10a again is reduced in magnitude so as to de-energize relay coil 5. This opens switches 5a and 5b. When indicator 16 is aligned with element 18a, shutter 18s blocks photo-sensor 12b from being illuminated. Thus, photo-sensor 12a is conductive and photo-sensor 12b is non-conductive. This means that the voltage appearing at output terminal 10b now is of sufficiently high magnitude to energize relay coil 7. Switches 7a, 7b thus close to couple the output from AM tuner 4 to output terminals 6L and 6R. Since photo-sensor 12a remains conductive, transistor 13 is non-conductive and thus does not shunt the relatively high voltage appearing at output terminal 10b.

When relay coil 5 is energized, as when indicator 16 is in alignment with element 17a, switch 9 is operated such that movable contact 9a engages fixed contact 9b so as to supply the DC operating voltage applied to power supply terminal 8 to FM tuner 3. Conversely, when relay coil 7 is energized and relay coil 5 is de-energized, switch 9 is operated such that movable contact 9a engages fixed contact 9c to supply the DC operating voltage from terminal 8 to AM tuner 4. If desired, switch 9 can be omitted, and DC power can be supplied to both FM tuner 3 and AM tuner 4 concurrently. Thus, energization of relay coils 5 and 7 merely select which of the tuners is coupled to output terminals 6L and 6R.

Figure 4:
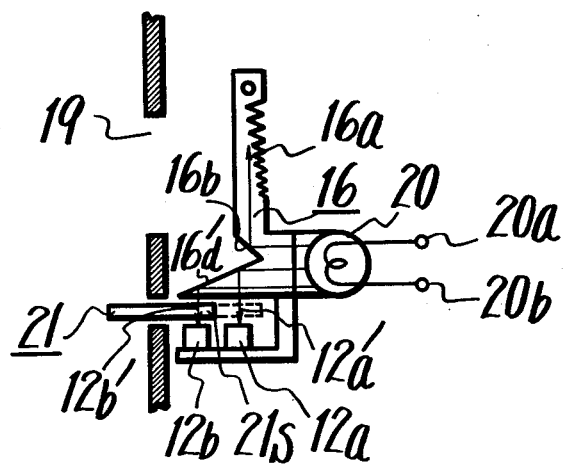
FIG. 4 is a cross-sectional view of another embodiment of the apparatus shown in FIG. 3.

In the embodiment shown in FIG. 3, it is assumed that photo-sensors 12a and 12b are disposed in vertical alignment with one photo-sensor, such as photo-sensor 12a, positioned above the other photo-sensor. Consistent with this vertical alignment of the photo-sensors, two separate tracks, or grooves, are provided for elements 17a, 17b and elements 18a, 18b, respectively. Another embodiment of an arrangement for the photo-sensors is illustrated in FIG. 4. In this alternative embodiment, photo-sensors 12a and 12b are positioned one behind the other and are disposed in the same horizontal plane. Accordingly, separate light reflecting surfaces 16c and 16d (FIG. 3) now are replaced by a single light reflecting surface 16d'. This single light reflecting surface 16d' reflects the light emitted from light source 20 onto both photo-sensors 12a and 12b. Furthermore, in the embodiment shown in FIG. 4, separate elements 17a and 18a for the FM and AM frequency bands, respectively, are replaced by a single element 21. Element 21 is, of course, slidable in a direction parallel to scales 15a and 15a'. Thus, element 21 can be aligned with a frequency gradation on the FM scale or with a frequency gradation on the AM scale, depending upon the user's preference. The particular frequency band which is selected by the positioning of element 21 is determined by the particular photo-sensor which is blocked by shutter portion 21s of the element.

In FIG. 4, element 21 is selectively positioned at one of two depths within the gap between the horizontal leg of indicator 16 and the photo-sensors. At a first position in this gap, shutter 21s blocks only photo-sensor 12b when indicator 16 is in alignment with element 21. At a second, deeper position, shutter 21s blocks both elements 12a and 12b. It is appreciated that if element 21 is set to select a particular AM frequency, then when indicator 16 is aligned with this preset element, only photo-sensor 12b is blocked to render this photo-sensor non-conductive. Hence, a relatively high voltage is provided at output terminal 10b to energize relay coil 7. Since photo-sensor 12a is not blocked at this time, the relatively low voltage provided at output terminal 10a is not sufficient to energize relay coil 5. Consequently, the output of AM tuner 4 is coupled via switches 7a, 7b to output terminals 6L and 6R.

If element 21 is depressed so as to be inserted deeper into the gap shown in FIG. 4, then shutter 21s blocks both photo-sensor 12a and photo-sensor 12b. It is recalled that this renders both photo-sensors non-conductive; but that the resultant higher voltage provided at output terminal 10a renders transistor 13 conductive. Hence, the relatively higher voltage which otherwise would appear at output terminal 10b because of the non-conduction of photo-sensor 12b is shunted by conductive transistor 13. Therefore, the voltage appearing at output terminal 10b is of a relatively low magnitude which is not sufficient to energize relay coil 7. Therefore, only relay coil 5 is energized so as to close switches 5a, 5b and thus couple the output of FM tuner 3 to output terminals 6L and 6R.

As yet another modification of the embodiment shown in FIG. 4, shutter portion 21s of element 21 can be provided only over a confined end portion of the element. The remainder of element 21 can be transparent. Thus, if element 21 is depressed so as to occupy the position shown by broken lines in FIG. 4, then the shutter portion 21s will block photo-sensor 12a, but the transparent portion of element 21 will permit light to pass therethrough and thus illuminate photo-sensor 12b. Therefore, photo-sensor 12a will be non-conductive, resulting in a relatively higher voltage at output terminal 10a, while photo-sensor 12b will be conductive, thus resulting in a relatively lower voltage at output terminal 10b.

While the present invention has been particularly shown and described with respect to preferred embodiments thereof, it will be readily apparent to those of ordinary skill in the art that various changes and modifications in form and details can be made without departing from the spirit and scope of the invention. For example, photo-sensors 12a and 12b may be comprised of photo diodes, photo transistors or other conventional photo-sensitive elements having different impedances whereby control signals are selectively provided at output terminals 10a and 10b in accordance with the particular illumination of such photo-sensitive elements. Furthermore, although the control signals selectively provided at output terminals 10a and 10b have been shown as selectively establishing transmission paths between one or the other tuner and output terminals 6L and 6R, these control signals alternatively may be used to control the operable condition, such as muting, of the respective tuners. It is, therefore, intended that the appended claims be interpreted as including these and other such changes and modifications.

What is claimed is:

1. Tuning apparatus of the type including at least first and second tuners operable to be tuned over respective broadcast frequency bands and further including a dial scale calibrated in at least two sets of gradations to represent the particular frequencies in said respective frequency bands to which said tuners are tuned and an indicator movable across said scale to indicate the frequency to which a respective tuner is tuned, said apparatus comprising at least one first settable means associated with a corresponding frequency band to be set to a desired location along said scale; at least one second settable means associated with a corresponding different frequency band to be set to a desired location along said scale; sensor means coupled to and movable with said indicator to sense each of said first and second settable means as said indicator is moved across said scale; control signal generating means for generating a respective control signal when said indicator is positioned such that said sensor means senses a corresponding one of said settable means; and means responsive to said respective control signal for providing an output from a respective one of said tuners.

2. The apparatus of claim 1 wherein said sensor means comprises a photo-sensor for each of said tuners and a light source spaced from said photo-sensors for illuminating said photo-sensors with light; and each of said settable means comprises a shutter positionable adjacent a desired frequency gradation and extending into the space between said light source and a respective photo-sensor to block the illumination of said respective photo-sensor when said indicator is juxtaposed said desired frequency gradation, whereby a control signal is generated when said photo-sensor is blocked.

3. The apparatus of claim 2 wherein said photo-sensors are mounted one atop the other with said light source interposed therebetween; and wherein the shutters associated with respective frequency bands are aligned in respective linear arrays.

4. The apparatus of claim 2 wherein said photo-sensors are mounted one behind the other with a common light source illuminating all of said photo-sensors; and wherein the shutters associated with respective frequency bands are aligned in a single linear array, each being movable in the direction in which said photo-sensors are mounted to selectively block respective ones of said photo-sensors.

5. The apparatus of claim 2 wherein said control signal generating means comprises a source of voltage; respective means for supplying said voltage to each of said photo-sensors and respective output terminals coupled between a respective photo-sensor and a respective voltage supplying means, wherein a photo-sensor is selectively conductive as a function of the illumination thereof to vary the voltage at the output terminal coupled thereto accordingly, thereby producing a control signal.

6. The apparatus of claim 5 wherein each photo-sensor is a photo-diode, and each voltage supplying means comprises a resistor.

7. The apparatus of claims 5 or 6 wherein said control signal generating means further comprises switch means connected in shunt relation with all but one of said photo-sensors and having a control input connected to the output terminal which is coupled to the remaining photo-sensor, said switch means being responsive to the voltage at the output terminal to which it is connected when the conductivity of said remaining photo-sensor is changed because the illumination thereof is blocked to prevent the voltage at any other output terminal from changing substantially even if the conductivity of the photo-sensor coupled to said other output terminal changes because the illumination thereof also is blocked.

8. The apparatus of claim 7 wherein said switch means comprises a transistor whose collector-emitter circuit is connected in shunt relation and whose base electrode constitutes said control input.

9. The apparatus of claims 1, 2, 3, 4, 5 or 6 wherein said means responsive to said respective control signal comprises a switch circuit connected between the output of each tuner and a common output, a respective one of said switch circuits being operated in response to a respective control signal to couple the output of a tuner to said common output.

10. The apparatus of claim 9 wherein each said switch circuit includes a relay coil and closable relay switch contacts, said relay coil being responsive to said control signal for closing said relay switch contacts.

11. The apparatus of claims 1, 2, 3, 4, 5 or 6 wherein said means responsive to said respective control signal comprises a source of operating voltage, respective switches to couple said operating voltage to said tuners, and means for energizing a respective one switch in response to said respective control signal, whereby a corresponding tuner is energized.

12. The apparatus of claim 1 wherein said tuners comprise an AM tuner and an FM tuner, respectively.

* * * * *